United States Patent
Sip et al.

(10) Patent No.: US 8,186,778 B2
(45) Date of Patent: May 29, 2012

(54) PORTABLE ELECTRONIC DEVICE WITH WHEELS

(75) Inventors: Kim-Yeung Sip, Shenzhen (CN); Xiong Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 286 days.

(21) Appl. No.: 12/569,911

(22) Filed: Sep. 30, 2009

(65) Prior Publication Data

US 2010/0231103 A1    Sep. 16, 2010

(30) Foreign Application Priority Data

Mar. 13, 2009    (CN) .......................... 2009 1 0300824

(51) Int. Cl.
*B60B 23/00* (2006.01)
*B60B 27/02* (2006.01)
*B60B 27/06* (2006.01)
*B60B 37/00* (2006.01)
*A47B 81/00* (2006.01)
*A47B 97/00* (2006.01)

(52) U.S. Cl. .............. 312/223.2; 301/111.05; 312/249.8

(58) Field of Classification Search ............... 312/223.1, 312/223.2, 249.8; 301/111.05, 125; 190/18 A; 16/32–34, 42 R; 280/43, 43.13, 43.14, 43.24; 220/628, 908

See application file for complete search history.

(56) References Cited

U.S. PATENT DOCUMENTS

| | | | | |
|---|---|---|---|---|
| 1,626,819 | A * | 5/1927 | Hazlett | 16/33 |
| 5,041,818 | A * | 8/1991 | Liu | 361/679.27 |
| 5,813,503 | A * | 9/1998 | Chang | 190/18 A |
| 6,340,085 | B1 * | 1/2002 | Huber et al. | 198/782 |
| 6,604,615 | B2 * | 8/2003 | Wu | 190/18 A |
| 6,691,961 | B2 * | 2/2004 | Solomon et al. | 248/129 |
| 6,725,956 | B1 * | 4/2004 | Lemire | 180/15 |
| 6,926,289 | B2 * | 8/2005 | Wang | 280/7.13 |
| 7,035,100 | B2 * | 4/2006 | Lord | 361/679.41 |
| 7,237,660 | B2 * | 7/2007 | Wu | 190/18 A |
| 7,511,951 | B2 * | 3/2009 | Liu et al. | 361/679.55 |
| 7,532,463 | B2 * | 5/2009 | Jacobs et al. | 361/679.48 |
| 7,798,455 | B2 * | 9/2010 | Kumazawa | 248/188.2 |

(Continued)

FOREIGN PATENT DOCUMENTS

TW    097148664    * 12/2008

*Primary Examiner* — Darnell M Jayne
*Assistant Examiner* — Andrew Roersma
(74) *Attorney, Agent, or Firm* — Altis Law Group, Inc.

(57) ABSTRACT

The portable electronic device includes a body, a bottom panel configured for supporting the body, at least two linear wheel assemblies assembled to the bottom panel in the body corresponding to the at least two first opening, and a directional wheel assembly assembled to the bottom panel in the body corresponding to the second opening. At least two first opening and a second opening defined in the bottom panel. Each linear wheel assembly and the directional wheel assembly include a wheel member and a driving member respectively. The driving member of each linear wheel assembly drives the wheel member of the corresponding linear wheel assembly to extend through the corresponding first opening and retract in the body. The driving member of the directional wheel assembly drives the wheel member of the directional wheel assembly to extend through the second opening and retract in the body and to rotate.

10 Claims, 5 Drawing Sheets

U.S. PATENT DOCUMENTS

| | | | |
|---|---|---|---|
| 2006/0191097 A1* | 8/2006 | Baumhakel | 15/320 |
| 2007/0034635 A1* | 2/2007 | Chiou | 220/810 |
| 2007/0246638 A1* | 10/2007 | Idehara et al. | 248/677 |
| 2007/0262214 A1* | 11/2007 | Kumazawa | 248/188.8 |
| 2008/0316692 A1* | 12/2008 | Jacobs et al. | 361/683 |
| 2009/0242343 A1* | 10/2009 | Chiang | 190/18 A |
| 2010/0025174 A1* | 2/2010 | Dayton | 190/18 A |
| 2010/0064944 A1* | 3/2010 | Su | 108/50.01 |
| 2010/0149752 A1* | 6/2010 | Lian | 361/679.59 |

* cited by examiner

PORTABLE ELECTRONIC DEVICE WITH WHEELS

BACKGROUND

1. Technical Field

The present disclosure relates to portable electronic devices and, particularly, to a portable electronic device with wheels.

2. Description of Related Art

Generally, a portable electronic device, such as a portable computer, is placed on a desktop. A position of the portable electronic device can be changed by pushing it or by lifting it. However, when pushing, the frictional forces between the portable electronic device and the desktop and/or the weight of the portable electronic device makes changing the position difficult.

Therefore, what is needed, is to provide a portable electronic device with wheels, which can overcome the above-mentioned problem.

DETAILED DESCRIPTION

Figure 1:
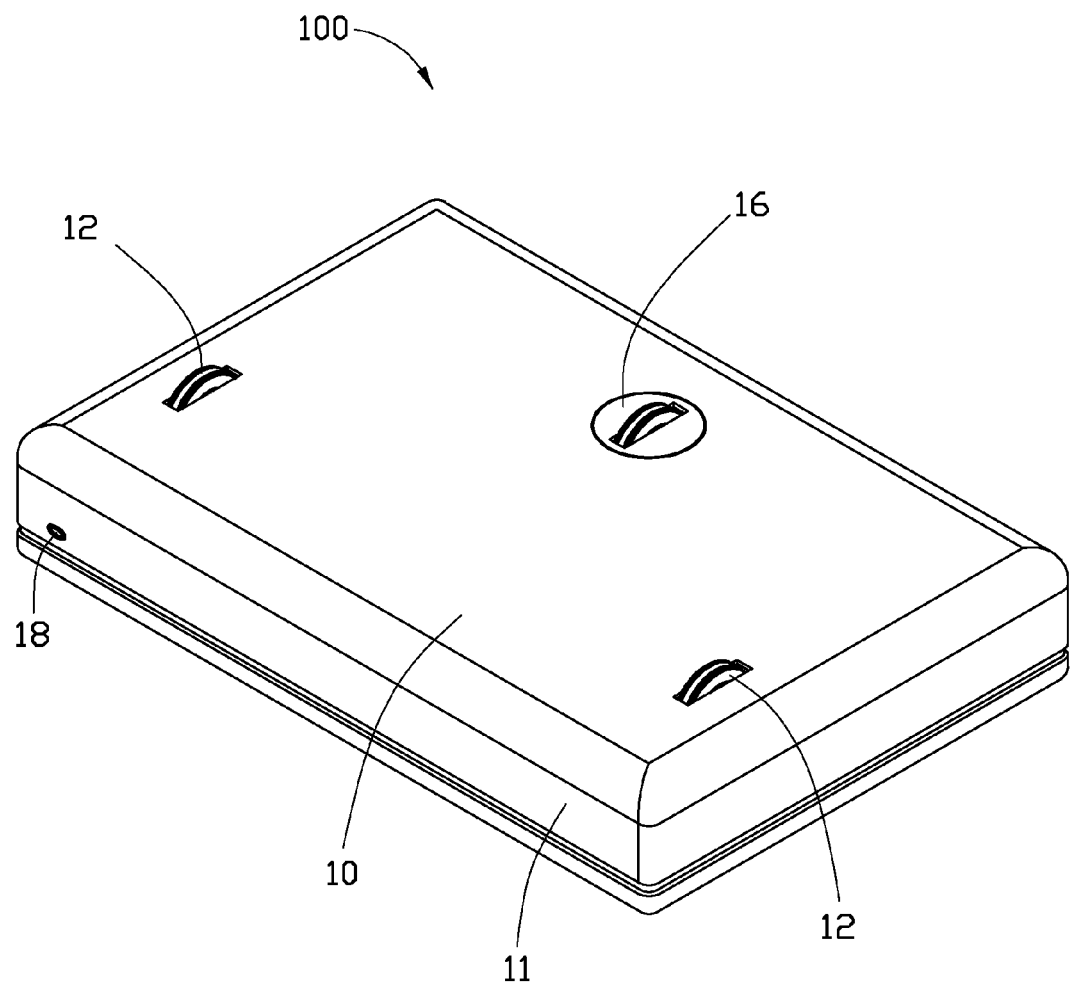
FIG. 1 is a schematic isometric view of a portable electronic device, according to an exemplary embodiment.
Figure 2:
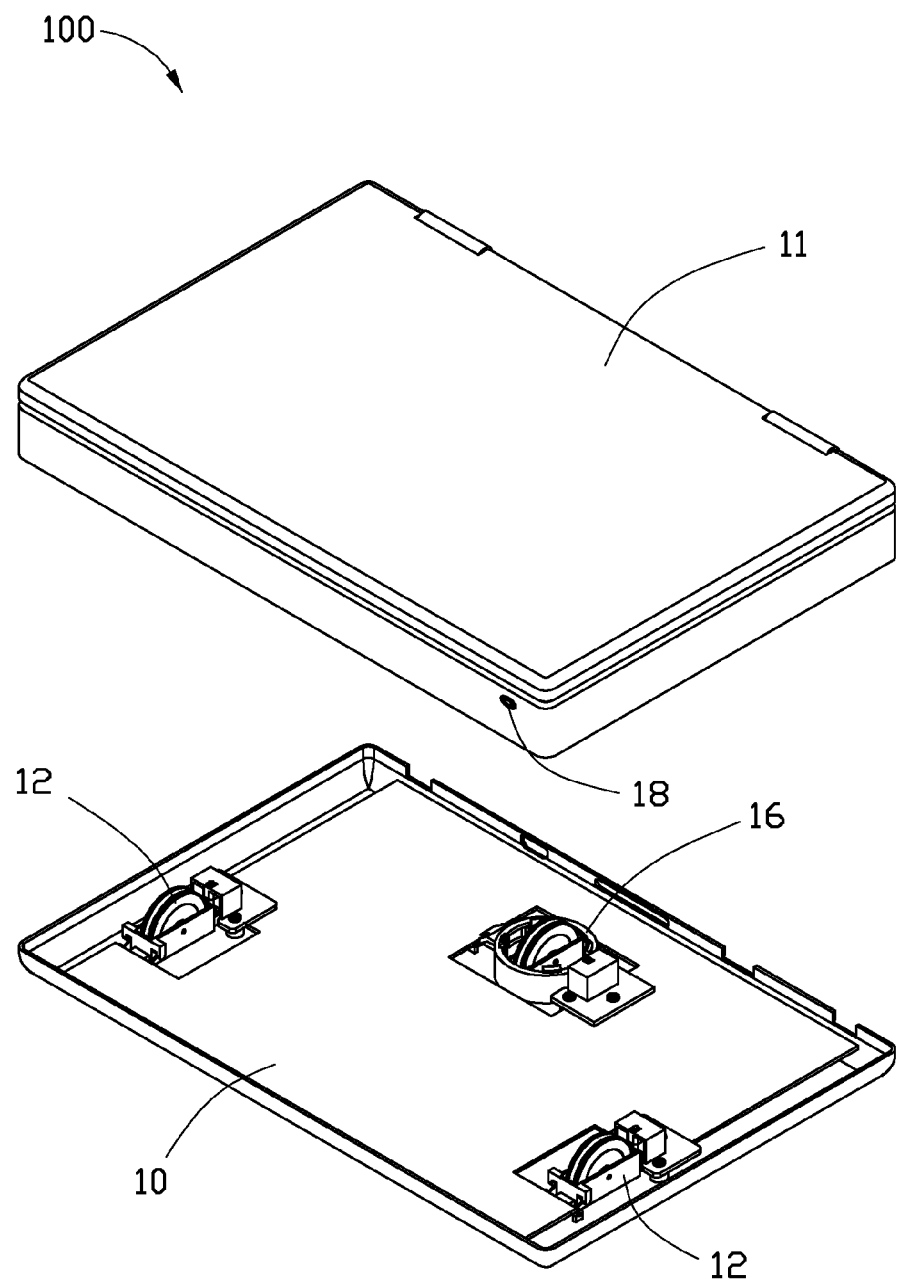
FIG. 2 is a partially exploded view of the portable electronic device of FIG. 1.

Referring to FIGS. 1-2, a portable electronic device 100, such as a portable computer, according to an exemplary embodiment, includes a bottom panel 10, a body 11, two linear wheel assemblies 12, a directional wheel assembly 16, and a control button 18. The bottom panel 10 is configured for supporting the body 11. The two linear wheel assemblies 12 and the directional wheel assembly 16 are assembled to the bottom panel 10. The control button 18 is positioned on the body 11, and is configured for controlling the two linear wheel assemblies 12 and the directional wheel assembly 16.

Figure 3:
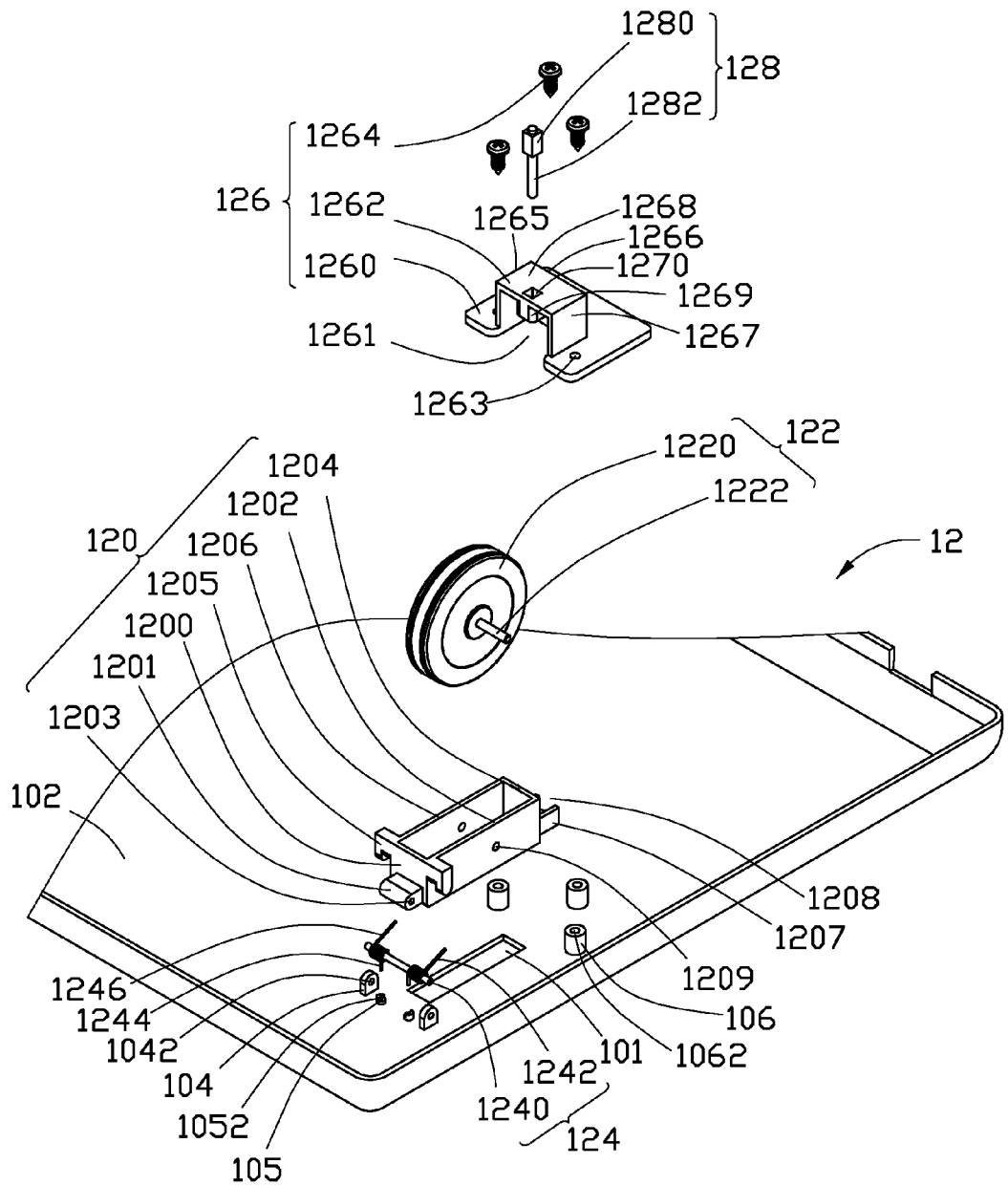
FIG. 3 is another partially exploded view of the portable electronic device of FIG. 2.
Figure 4:
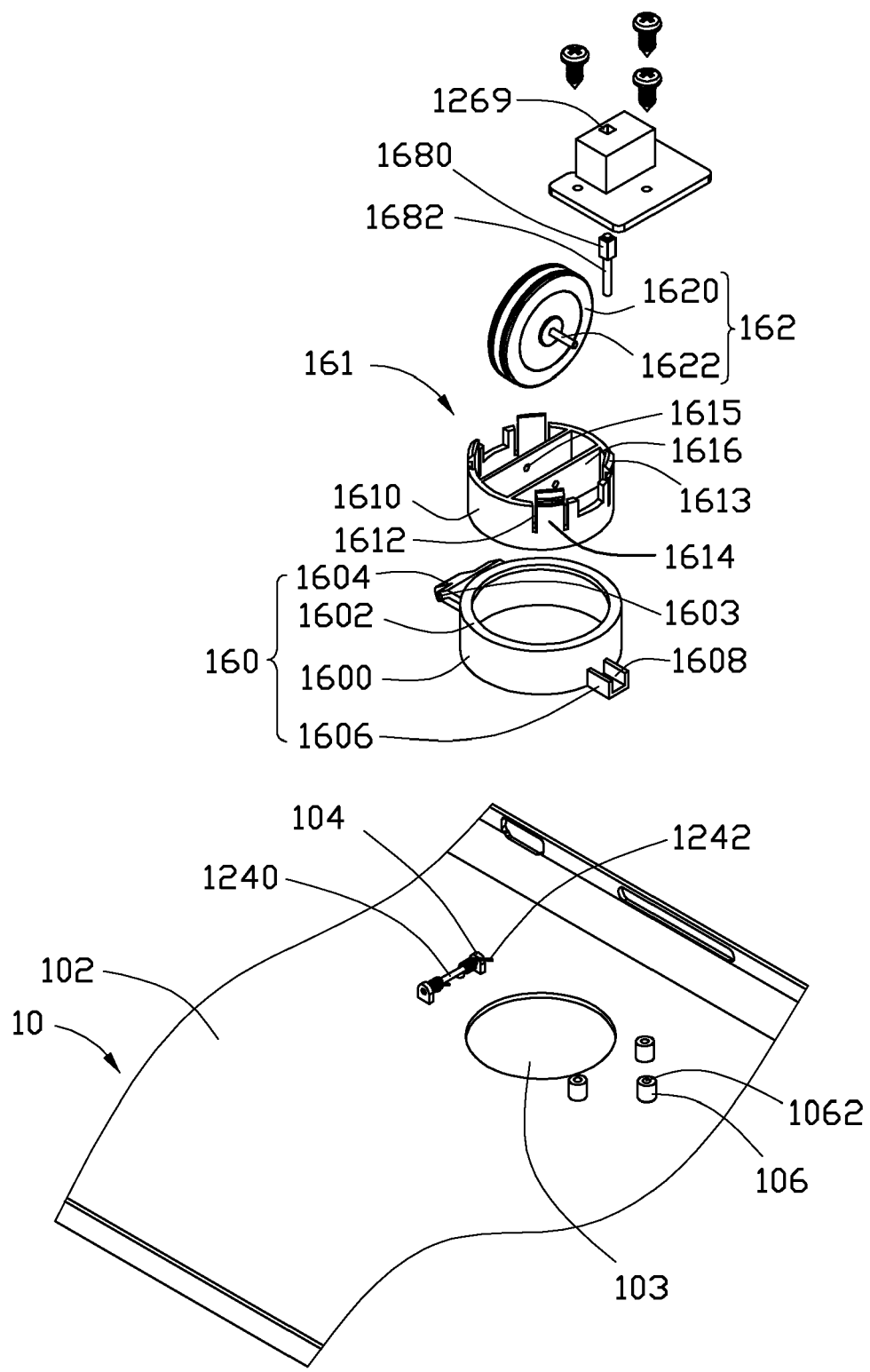
FIG. 4 is a further partially exploded view of the portable electronic device of FIG. 2.
Figure 5:
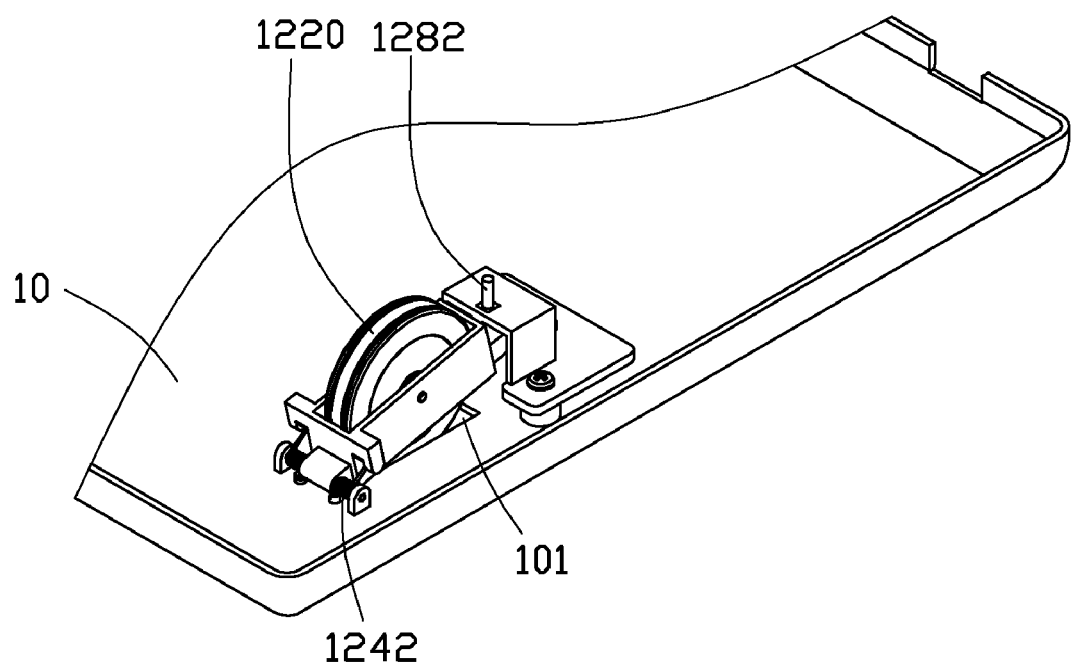
FIG. 5 is a schematic isometric view of a linear wheel assembly of the portable electronic device of FIG. 2, showing the linear wheel assembly in a retracted state.

Referring to FIGS. 2-4, the bottom panel 10 includes an inner surface 102 facing the body 11. Two first openings 101 and a second opening 103 are defined in the inner surface 102. The two first openings 101 and the second opening 103 form three corners of an isosceles triangle correspondingly. Two opposite supporting portions 104 are formed on the inner surface 102 at one side of each opening 101, 103. The two supporting portions 104 are symmetrical to each other relative to each opening 101, 103. A first fixing hole 1042 is defined in each supporting portion 104. An axial direction of each of the first fixing holes 1042 is parallel to the bottom panel 10. Two opposite fixing portions 105 are formed on the inner surface 102 between the two supporting portions 104. A second fixing hole 1052 is defined in each fixing portion 105. An axial direction of each of the second fixing holes 1052 is perpendicular to the bottom panel 10. Three screw holders 106 are formed on the inner surface 102 at the other side of each opening 101, 103. A threaded hole 1062 is defined in each screw holder 106. The three screw holders 106 form three corners of an isosceles triangle correspondingly. In this embodiment, the first openings 101 are slots, and the second opening 103 is a circular through hole.

Each linear wheel assembly 12 includes a hollow first retaining frame 120, a wheel member 122, a connecting member 124, a seat 126 and a driving member 128.

The first retaining frame 120 is approximately rectangular and faces each first opening 101. The first retaining frame 120 includes a first sidewall 1200, a second sidewall 1202, a third sidewall 1204, and a fourth sidewall 1206. The first sidewall 1200 is parallel with the third sidewall 1204. The second sidewall 1202 is parallel with the fourth sidewall 1206.

A first protrusion 1201 extends from the first sidewall 1200. A first through hole 1203 is defined in the first protrusion 1201 and is aligned with the first fixing holes 1042. Two tabs 1205 extend from opposite sides of the first sidewall 1200 and perpendicular to the second sidewall 1202 and the fourth sidewall 1206 correspondingly.

A second protrusion 1207 is formed on the third sidewall 1204. A first receiving groove 1208 is defined in the second protrusion 1207. Two first retaining holes 1209 are correspondingly defined in the second sidewall 1202 and the fourth sidewall 1206 corresponding to each other.

The wheel member 122 includes a wheel 1220 and a connecting shaft 1222. The wheel 1220 non-rotatably sleeves on the connecting shaft 1222. The connecting shaft 1222 is rotatably engaged in the two retaining holes 1209 so that the wheel member 122 is rotatably connected to the first retaining frame 120 and is partially received in the first openings 101.

The connecting member 124 includes a pole 1240 and two torsion springs 1242. The pole 1240 extends through the two first fixing holes 1042, the two torsion springs 1242, and the first through hole 1203, and is fixed to the two supporting portions 104. One end 1244 of each torsion spring 1242 is fixed in the second fixing hole 1052, and the other end 1246 of each torsion spring 1242 abuts the corresponding tab 1205. Thereby, the first retaining frame 120 is rotatably connected to the supporting portions 104.

The seat 126 includes a plate 1260, a restricting portion 1262 extending from the plate 1260, and three screws 1264 corresponding to the three screw holders 106.

A first cutout 1261 is defined in the plate 1260 corresponding to the second protrusion 1207. Three second through holes 1263 are defined in the plate 1260 corresponding to the three screw holders 106. Each screw 1264 extends through the corresponding second through holes 1263 and is engaged in the corresponding threaded hole 1062 so that the seat 126 is fixed to the bottom panel 10. In this embodiment, the first cutout 1261 is rectangular.

The restricting portion 1262 includes a first wall 1265, a second wall 1266, a third wall 1267, and a top wall 1268. The first wall 1265, the second wall 1266, and the third wall 1267 cooperatively encircle the first cutout 1261 and cooperatively support the top wall 1268 so that the top wall 1268 is away from the plate 1260 and faces the first cutout 1261. A hollow post 1269 extends from the top wall 1268 adjacent to the first cutout 1261 and faces the second protrusion 1207. A third through hole 1270 is defined in the top wall 1268 and communicates with the hollow post 1269.

The driving member 128 includes an actuator 1280 and a movable shaft 1282. The actuator 1280 is fixed in the hollow post 1269 and electrically connected to the control button 18 by wires (not shown). The movable shaft 1282 passes through the third through hole 1270 and is movably received in the actuator 1280. The actuator 1280 is configured for driving the movable shaft 1282 to move. In this embodiment, the driving member 128 is a linear motor.

Referring to FIG. 4 together with FIG. 3, the directional wheel assembly 16 is similar to the linear wheel assembly 12. The differences between the directional wheel assembly 16 and the linear wheel assembly 12 are that the directional wheel assembly 16 includes a second retaining frame 160 and a rotatable frame 161 instead of the first retaining frame 120.

The second retaining frame 160 is a hollow cylinder and faces the second opening 103. The second retaining frame 160 includes a first circular sidewall 1600 and an engaging portion 1602 extending inwards from a top end surface of the circular sidewall 1600 to the center axis of the second retaining frame 160. A third protrusion 1604 is formed on the first circular sidewall 1600 adjacent to the supporting portions 104. A fourth through hole 1603 is defined in the third protrusion 1604. An axial direction of the fourth through hole 1603 is parallel to the bottom panel 10. The pole 1240 extends through the two first fixing holes 1042, the two torsion springs 1242, and the fourth through hole 1603, and is fixed to the two supporting portions 104 adjacent to the second opening 103. The end 1244 of each torsion spring 1242 adjacent to the second opening 103 is fixed in the second fixing hole 1052, and the other end 1246 of each torsion spring 1242 adjacent to the second opening 103 abuts the third protrusion 1604. Thereby, the second retaining frame 160 is rotatably connected to the supporting portions 104. A fourth protrusion 1606 is formed on the first circular sidewall 1600 adjacent to the screw holders 106. A second receiving groove 1608 is defined in the fourth protrusion 1606.

The rotatable frame 161 includes a second circular sidewall 1610, four connecting portions 1614 and two parallel ribs 1616. The second circular sidewall 1610 defines four second cutouts 1612. The four connecting portions 1614 extend from the lower portions of the four cutouts 1612. The parallel ribs 1616 are fixed in the rotatable frame 161. An engaging groove 1613 is defined in a distal end of each connecting portion 1614. Two second retaining holes 1615 are defined in the ribs 1616 and correspond to each other. The engaging portion 1602 is rotatably received in the engaging grooves 1613 so that the rotatable frame 161 is rotatably connected to the second retaining frame 160. The connecting shaft 1622 of the wheel member 162 is rotatably received in the two second retaining holes 1615 so that the wheel member 162 is rotatably received in the rotatable frame 161.

Referring to FIGS. 2-5, when the control button 18 is inactive, one end of the first retaining frame 120 is lifted away from the bottom panel 10 by the restoring force of the torsion springs 1242 adjacent to the first opening 101. Each post 1269 adjacent to the first opening 101 is received in the first receiving groove 1208 and each movable shaft 1282 adjacent to the first opening 101 contacts the bottom of the first receiving groove 1208. As a result, the wheel 1220 is retracted in the body 11. One end of the second retaining frame 160 is lifted away from the bottom panel 10 by the restoring force of the torsion springs 1242 adjacent to the second opening 103. The post 1269 adjacent to the second opening 103 is received in the second receiving groove 1608 and the movable shaft 1682 contacts the bottom of the second receiving groove 1608. As a result, the wheel 1620 is retracted in the body 11.

Referring to FIGS. 1 and 3 to 5, when the control button 18 is activated: each movable shaft 1282 adjacent to the first opening 101 is driven by the corresponding actuator 1280 to push the bottom of the first receiving groove 1208; the first retaining frame 120 is pushed toward the bottom panel 10; each wheel 1220 extends through the corresponding first opening 101; each movable shaft 1682 adjacent to the second opening 103 is driven by the corresponding actuator 1680 to push the bottom of the second receiving groove 1608; the second retaining frame 160 is pushed toward the bottom panel 10; and the wheel 1620 extends through the second opening 103. As a result, the portable electronic device 100 can move on a desktop by pushing the body 11. When the portable electronic device 100 is in motion, the rotatable frame 161 can rotate because the engaging portion 1602 is rotatably received in the engaging grooves 1613. Therefore, the wheel 1620 of the directional wheel assembly 16 can change a moving direction of the portable electronic device 100. As a result, a position of the portable electronic device 100 can be easily changed. Furthermore, the wheels 1220, 1620 are retractable in the body 11 so that the portable electronic device 100 can be stable on the desktop.

It is to be understood, however, that even though numerous characteristics and advantages of the present embodiments have been positioned fourth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A portable electronic device comprising:
   a body;
   a bottom panel configured for supporting the body;
   two first openings and a second opening defined in the bottom panel; the two first openings and the second opening forming three corners of an isosceles triangle correspondingly;
   two opposite supporting portions being formed on the bottom panel at one side of each opening and being symmetrical to each other relative to each opening;
   two opposite fixing portions being formed on the bottom panel between the two supporting portions;
   at least two screw holders formed on the bottom panel at the other side of each opening;
   at least two linear wheel assemblies assembled to the bottom panel in the body corresponding to the two first openings;
   a directional wheel assembly assembled to the bottom panel in the body corresponding to the second opening;
   each linear wheel assembly and the directional wheel assembly comprise a wheel member and a driving member respectively; and
   a control button electrically connected to the driving members for controlling the driving members to drive the wheel members;
   wherein the driving member of each linear wheel assembly drives the wheel member of the corresponding linear wheel assembly to extend through the corresponding first opening and retract in the body, the driving member of the directional wheel assembly drives the wheel member of the directional wheel assembly to extend through the second opening and retract in the body and to rotate, and the wheel members of the linear wheel assemblies and the wheel member of the directional wheel assembly are driven to extend out of the bottom panel simultaneously and driven to retract in the body simultaneously.

2. The portable electronic device as claimed in claim 1, wherein each linear wheel assembly further comprises a hollow first retaining frame movably assembled to the bottom panel corresponding to the first opening, and the wheel member of the linear wheel assembly is received in the first retaining frame; the directional wheel assembly further comprises a hollow second retaining frame moveably assembled to the bottom panel corresponding to the second opening and a rotatable frame, the rotatable frame is rotatably connected to the second retaining frame, and the wheel member of the directional wheel assembly is rotatably received in the rotatable frame.

3. The portable electronic device as claimed in claim 2, wherein each linear wheel assembly and the directional wheel assembly comprise a connecting member respectively; each connecting member comprises a pole and two torsion springs; a first protrusion and a second protrusion extend on two ends of the first retaining frame; a first through hole is defined in the first protrusion; the pole extends through the supporting portions, the torsion springs, and the first through hole, and is fixed to the supporting portions; one end of each torsion spring is fixed in the fixing portions, and the other end of each torsion spring abuts the first retaining frame so that the first retaining frame is movably connected to the bottom panel; a third protrusion and a fourth protrusion extend on two ends of the second retaining frame; the pole extends through the supporting portions, the torsion springs, and the third protrusion, and is fixed to the supporting portions; one end of each torsion spring is fixed in the fixing portions, and the other end of each torsion spring abuts the third protrusion so that the second retaining frame is movably connected to the bottom panel.

4. The portable electronic device as claimed in claim 3, wherein two tabs extend from the first retaining frame; one end of each torsion spring is fixed in the fixing portions, and the other end of each torsion spring abuts the two tabs.

5. The portable electronic device as claimed in claim 3, wherein each linear wheel assembly and the directional wheel assembly comprise a seat respectively; each seat comprises a plate and at least two screws corresponding to the at least two screw holders; a first cutout is defined in the plate, at least two second through holes are defined in the plate corresponding to the at least two screws; each screw extends through the corresponding second through hole and is engaged in one of the at least two screw holders so that the seat is fixed to the bottom panel.

6. The portable electronic device as claimed in claim 5, wherein the seat further a restricting portion extending from the plate; the restricting portion comprises a first wall, a second wall, a third wall, and a top wall; the first wall, the second wall, and the third wall encircle the first cutout and cooperatively support the top wall so that the top wall is away from the plate and faces the first cutout; a hollow post extends from the top wall adjacent to the first cutout and faces the second protrusion and the fourth protrusion respectively; a third through hole is defined in the plate and communicates with the hollow post.

7. The portable electronic device as claimed in claim 6, wherein each driving member comprises an actuator and a movable shaft; the actuator is fixed in the hollow post and electrically connected to the control button; the movable shaft passes through the third through hole and is movably received in the actuator.

8. The portable electronic device as claimed in claim 7, wherein the driving member is a linear motor.

9. The portable electronic device as claimed in claim 7, wherein the second retaining frame is a hollow cylinder; the second retaining frame comprises a first circular sidewall and an engaging portion extending inwards from a top of the circular sidewall to a center axis of the second retaining frame; the rotatable frame comprises a second circular sidewall defining four second cutouts and four connecting portions extending from lower portions of the second cutouts; an engaging groove is defined in a distal end of each connecting portion; the engaging portion is engaged in the engaging grooves so that the rotatable frame is rotatably connected to the second retaining frame.

10. The portable electronic device as claimed in claim 9, wherein the rotatable frame further comprises two parallel ribs across the rotatable frame, the wheel member passes through the ribs so that the wheel member is received in the second rotatable frame.

* * * * *